United States Patent [19]

Boucard

[11] Patent Number: 5,001,544
[45] Date of Patent: Mar. 19, 1991

[54] PRODUCT IN TAPE FORM FOR SUPPORTING AND CONVEYING ELECTRONIC COMPONENTS

[75] Inventor: Michel Boucard, Tournefeville, France

[73] Assignee: Bendix Electronic S.A., Toulouse, France

[21] Appl. No.: 262,753

[22] Filed: Oct. 19, 1988

[30] Foreign Application Priority Data

Oct. 22, 1987 [FR] France ................... 87 14629

[51] Int. Cl.$^5$ ............................ H01L 23/48
[52] U.S. Cl. ..................................... 357/70
[58] Field of Search ................. 357/68, 69, 70

[56] References Cited

U.S. PATENT DOCUMENTS

| | | | |
|---|---|---|---|
| 4,138,691 | 2/1979 | Bonkohara et al. | 357/70 |
| 4,466,183 | 8/1984 | Burns | 29/827 |
| 4,480,150 | 10/1984 | Jones | 174/52 FP |
| 4,812,421 | 3/1989 | Jung et al. | 437/211 |

FOREIGN PATENT DOCUMENTS 2317852  3/1980  France .

OTHER PUBLICATIONS

Patent Abstracts of Japan, vol. 10, No. 141.

*Primary Examiner*—James W. Davie
*Attorney, Agent, or Firm*—Russel C. Wells; George L. Boller

[57] ABSTRACT

The produce comprises an electrically conductive tape cut out or etched so as to form windows from which connecting tabs for a chip project, according to the "single-layer" T.A.B. technology. An adhesive tape is glued to the conductive tape and pierced with windows centered on and lying within the conductive tape's windows. According to the invention, apertures isolate the connecting tabs for the purpose of applying test signals to the chip by means of the tabs then carried by the adhesive tape alone. The invention is used for testing integrated power circuits.

12 Claims, 1 Drawing Sheet

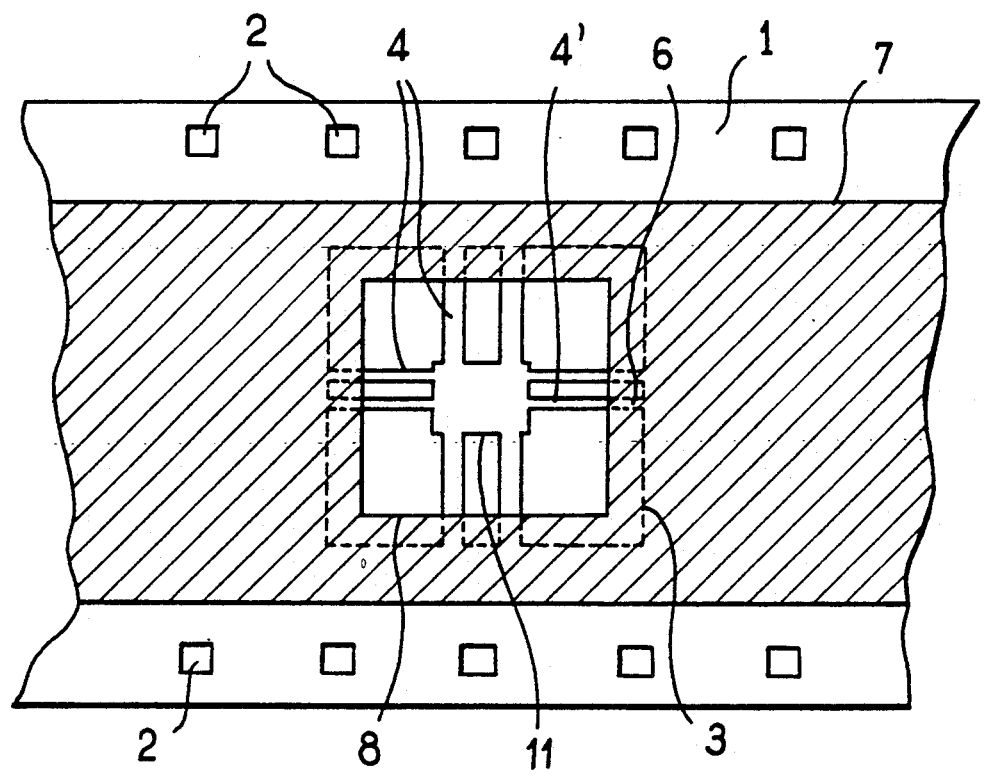
FIG_1
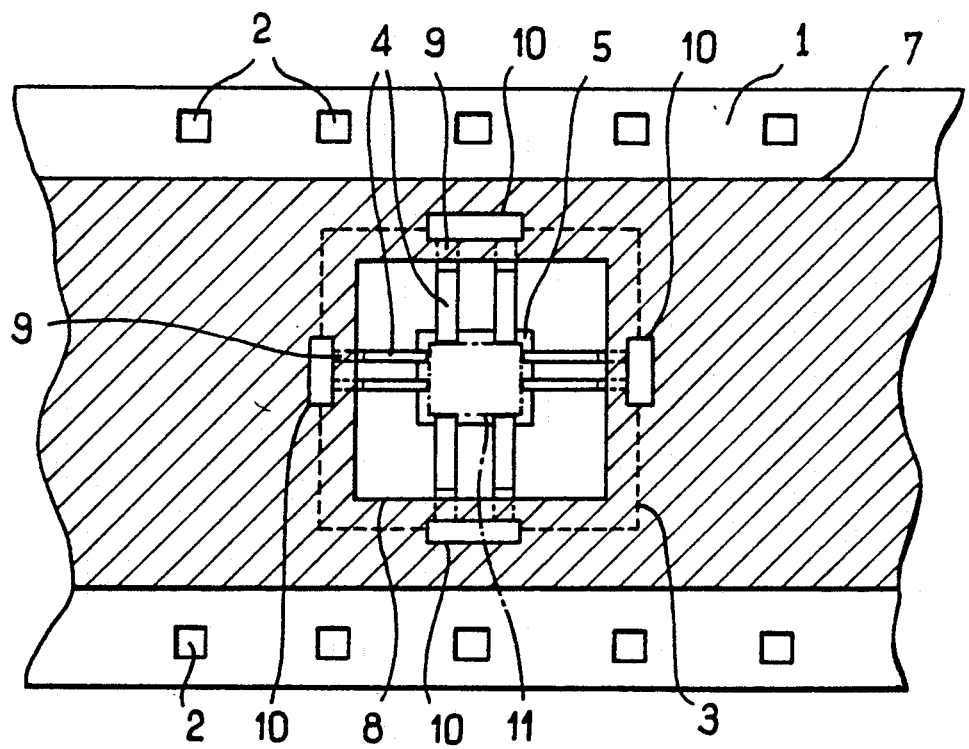
FIG_2

PRODUCT IN TAPE FORM FOR SUPPORTING AND CONVEYING ELECTRONIC COMPONENTS

BACKGROUND OF THE INVENTION

The present invention relates to a product in tape form for supporting, conveying and testing electronic components and to a process for producing it.

More particularly, the invention relates to such a product derived from the technology of assembling electronic semiconductor components which is known as T.A.B. (an abbreviation of the English expression "Tape Automated Bonding").

The T.A.B. technology is used to a great extent today for assembling integrated circuits in electronic devices when it is expedient for manufacture to be in large series or with a high production rate or to have components with a large number of outputs. This technology utilizes the principle of conveying parts mounted on tapes towards assembly stations. These tapes are produced so as to provide the chip with all its input/output connections, or "tabs", to the receiving circuit, the connections being formed in an electrically conductive layer of the tape by mechanical cutting out, photoetching or any other process, such as the laser-cutting process described in European Patent Application No. 130,498.

In particular, an alternative version of the T.A.B. technology, called "single-layer", is known, and in this a single metal tape provides both the support necessary for conveying the chips and the input/output connections of each chip. Since these connections are integral with the tape, it is expedient to separate them from this tape before carrying out the folding of the "tabs" and the installation of the chip in the receiving circuit. It will be noted that, before this separation, all the connections or "tabs" of the chip are short-circuited because of their connections with the metal tape. Under these conditions, it is not possible to conduct tests of the chip before the latter has been detached from the tape. However, it would be very convenient to carry out these tests when the chips are still integral with the tape.

There is a known process which involves molding on the chip and two electrically insulated test outputs, in order to keep the chip attached to the conductive tape. The chip can then be passed through a test appliance which ensures that the outputs of the chip are held in place and which is therefore not standard.

U.S. Pat. No. 4,480,150 and British Application No. 2,169,553 describe conveyor tape structures allowing tests on the chips carried by the tape. In particular, the abovementioned British application relates to such a structure using the T.A.B. technology. However, the structure provided is of the "three-layer T.A.B." type and cannot be transferred to a tape of the "single-layer T.A.B." type.

Now this last structure proves expedient and even indispensable in some uses, such as the T.A.B. assembly of power chips which implies the flow of relatively high currents in some connections. The considerable thickness of the conductive tape (at the present time 70 μm or 105 μm in single-layer T.A.B.) allows the passage of such currents higher than those acceptable in T.A.B. technology with two or three layers.

SUMMARY OF THE INVENTION

The object of the present invention is, therefore, to provide a product in tape form, of the type used in single-layer T.A.B. technology and designed to allow tests on chips mounted on the product, when these chips are integral with the product, in standard test appliances.

An object of the present invention is also to provide such a product in tape form intended more particularly for the assembly of power chips.

Yet another object of the present invention is to provide a process for producing this product in tape form.

These objects of the invention and others which will emerge later are achieved with a product in tape form for supporting and conveying electronic components staggered on the product, comprising a tape made of electrically conductive material and cut with a staggered series of windows, and electrical connection tabs cut out from the tape within each window, starting from the contour of the latter, these tabs each being associated with one of the outputs of an electronic component. According to the present invention, an electrically insulating adhesive piece applied to that face of the conductive tape not receiving the components, so as to adhere to this and to the connection tabs at least in the vicinity of the contour of the window, within and on the outside of the latter, at least one aperture passing through the product in order to ensure the electrical insulation of at least one tab without breaking its connection with the adhesive piece.

The invention also provides a process for producing the above-defined product, according to which there are formed in a tape made of electrically conductive material windows staggered on the tape and having a set of electrical connection tabs cut out from the tape within each window, starting from the contour of the latter, so as to each be associated with an output of an electronic component to be mounted on these tabs. According to the present invention, an electrically insulating adhesive piece is glued against that face of the conductive tape not intended for receiving the components, in such a way that this adhesive piece covers at least the contour of the window and zones internally and externally adjacent to this, and at least one aperture is pierced through the product and is arranged in such a way as to ensure the electrical insulation of at least one connection tab relative to the conductive tape, without breaking the connection between this tab and the adhesive piece.

BRIEF DESCRIPTION OF THE DRAWING

In the accompanying drawing, FIGS. 1 and 2 show plan views of part of the product in tape form according to the invention, at two successive stages of its manufacture.

DESCRIPTION OF THE PREFERRED EMBODIMENT

This product (see FIG. 1) is composed essentially of a tape (1) made of electrically conductive material and pierced laterally with two rows of perforations (2) suitable for driving and indexing the tape, as is well known in the art. The tape is also pierced with uniformly staggered windows (3). Radiating from the edge of the window (3) on the inside are electrical connection tabs, such as (4) or (4'), cut out from the conductive material of the tape (1) in order to make a connection between the inputs/outputs of an electronic component, such as a "chip", forming an integrated circuit, and an electronic device of which this integrated circuit forms an element. The tabs are cut out from the tape at the same time as the window and are therefore then integral with the tape (1) at their bases in the region of the contour of the window (3), as shown at (6) in FIG. 1 with regard to the tab (4'). The ends of the tabs which are opposite the bases are also made integral with one another by means of a central part (11) cut out in the window (3) at the same time as the tabs.

After this central part (11) has been removed, a chip can be connected to the ends of the tabs The chip/tab connection is made by the welding of a contact stud, provided on the chip, to the free end of a tab associated with this stud. At this juncture in the description, the tape (1) conforms completely to a single-face T.A.B. tape known in the art (see, for example, the tape illustrated in FIG. 2 of European Patent Application No. 130,498 mentioned above). Such tapes, after the chip has been connected to the tabs, do not allow test signals to be applied to these tabs, because the bases (6) of these tabs are short-circuited by the conductive tape (1) itself. It is not possible to check the proper operation of the chip before the latter, together with its connection tabs, is detached from the tape. The chip then has to be reoriented in a test station, and this involves time and handling and therefore additional costs.

According to the present invention, the abovedescribed tape is improved by adding to it means suitable for insulating the connection tabs electrically, whilst at the same time maintaining the function of supporting and conveying the chip by the tape.

To achieve this, the product in tape form according to the invention also comprises an adhesive piece, such as an adhesive tape (7) bonded, for example, to that face of the product which is opposite that carrying the chip. According to a preferred embodiment of the invention, the adhesive tape (7) is of a width less than that of the conductive tape (1), so as not to cover the rows of perforations. The adhesive tape (7) is pierced with windows (8) uniformly staggered at the same interval as the windows (3) of the conductive tape (1). During the gluing together of the tapes (1) and (7), means are provided for fixing the locations of the windows (3) and (8), so as to ensure their concentricity. According to the embodiment illustrated in FIG. 1, the two windows are rectangular and the window (8) has a contour parallel to and within that of the window (3). It thus emerges that the base (6) of each connection tab is covered by the adhesive tape (7). The purpose of this covering is to ensure, in a subsequent step of the production of the product, that the tabs and the chip are supported by the adhesive tape, as will be seen later in conjunction with an examination of FIG. 2. However, the window (8) of the adhesive tape allows a clearance for the chip and the largest part of the tabs, so as not to interfere with these when they are detached from the product according to the invention at the station where the insertion of the chip into the electronic circuit of which it forms a component is carried out.

The adhesive piece can be formed from a support covered with an adhesive layer or from an "unsupporting" film composed of a film of a polymerizable adhesive product and partially polymerized on one face to give it sufficient mechanical stability. According to another alternative version, the adhesive piece can be produced by molding on an adhesive product round the window (3), this molding-on being obtained, for example, by screen printing.

As described hitherto, the product according to the invention still does not allow the chip to be tested.

This object of the invention is achieved by piercing (see FIG. 2 showing the product according to the invention in its final state) apertures (10) which pass through the two tapes (1) and (7) near the bases (6) of at least some of the tabs (4, 4'), in order, at this location, to break any electrical connection between these tabs when the latter are designed to transmit test signals to a chip (5) or when the insulation of a particular tab is necessary for conducting tests. Insofar as some tabs can remain short-circuited without disrupting the tests, or if this short-circuit is necessary for carrying out the tests, no aperture is pierced at the base of the corresponding tabs. In principle, however, the electrical insulation of all the tabs, as shown in the figure is necessary.

It will be seen that the apertures (10) are placed astride the contour of the window (3) with a reserve relative to the contour of the window (8) which provides sufficient room on the adhesive tape for the parts (9) of the tabs, so as to keep these tabs firmly in place on the product in tape form according to the invention by adhesion, despite the fact that the bases (6) of these tabs are then physically separate from the conductive tape (1) as a result of the piercing of the apertures (10) in the product.

When the chip (5) has thus been connected to the tabs (4) secured in this way to the product in tape form according to the invention, it is possible to convey the chips carried by this product in tape form successively up to a test station where electrodes provided in the station are selectively put in contact with electrically insulated connection tabs, in order to apply test signals to the chip and obtain output signals making it possible to analyse the results of the test.

The present invention also relates to a process for producing the product in tape form according to the invention. This process involves first forming in an electrically conductive tape (for example a copper tape of a thickness of 70 μm or 105 μm and in any one of the standard widths: 8, 16, 35 or 70 mm) staggered windows (3), from the contour of which electrical connection tabs project on the inside. Various known techniques of mechanical or laser cutting or of photoetching can be used for this purpose, as mentioned above. According to the invention, an electrically insulating adhesive tape pierced with windows (8) uniformly staggered at the same interval as the windows of the conductive tape are subsequently glued to the conductive tape so formed. The adhesive tape is laid onto that face of the conductive tape which is opposite that receiving the chips. The adhesive tape can be placed by rolling or transfer and pressing, cold or hot in both cases, according to known techniques. Known location-fixing means are used to ensure the centering of the windows (8) of the adhesive tape with the windows (3) of the conductive tape, these latter having dimensions larger than those of the windows (8), as was seen above.

The chips (5) are subsequently welded to the intermediate product so formed and the apertures (10) for insulating the tabs are punched.

According to an alternative version, these last two operations are reversed. In this case, it is appropriate to ensure that the ends of the tabs opposite the bases (6) are held in place before the punching operation by preserving a connection between the tabs in this region by means of the part (11) of the conductive tape delimited by dot-and-dash lines in the figure. At the moment of punching, this part (11) is removed at the same time as the material within the contours of the apertures (10).

As illustrated in the figure, an aperture (10) can encompass the bases (6) of two adjacent tabs. It is clear that the number of bases (6) encompassed by an aperture can vary according to requirements. Nevertheless, the distribution of apertures round the window (3) which is adopted is one which does not impair the cohesion of the two tapes (1) and (7), particularly in the part located between the windows (3) and (8). These are arrangements which are left to the initiative of a person skilled in the art.

Various alternative versions can arise from the present description of a preferred embodiment of the product according to the invention, without departing from the scope of the present invention. For example, the adhesive tape can be replaced by adhesive frames fastened by location-fixing to the windows (3), so as to project on the inside of these windows in order to support the ends of the connection tabs there. Likewise, the insulating apertures (10) can assume other forms and/or other positions, provided, however, that they ensure effective electrical insulation of the connection tabs, whilst at the same time allowing the insulated tabs to be supported by the tape or the adhesive frame.

Thus, the invention provides a product in tape form, the electrically conductive part of which can be produced by the "single-face" T.A.B. technique and which allows the chips to be tested by passing the product through a standard test station. After the test, the product in tape form can be used to convey the chips into a tab-folding or assembly station, where the tabs are cut inside the window (8). No trace of adhesive therefore remains on these tabs. Moreover, the production of the product according to the invention from a single tape of an electrically conductive material makes it possible to etch this tape on both faces at the same time or even punch it. It is thus possible to use a conductive tape of a thickness compatible with the currents received in integrated power circuits.

I claim:

1. A product in tape form for supporting and conveying electronic components staggered on the product, comprising a tape made of electrically conductive material and cut with a staggered series of windows, and electrical connection tabs cut out from the tape within each window, starting from the contour of the latter, these tabs each being associated with one of the outputs of an electronic component, characterized in that it comprises an electrically insulating adhesive piece applied to that face of the conductive tape not receiving the component, so as to adhere to said conductive tape and to the connection tabs at least in the vicinity of the contour of the window, said adhesive piece overlapping the window contour so as to lie both within and without the window and, at least one aperture passing through both the adhesive piece and the conductive tape in order to ensure the electrical insulation of at least one of said connection tabs without breaking its adherence to the adhesive piece.

2. The product as claimed in claim 1, wherein the adhesive piece is an adhesive tape cut with a succession of windows staggered at the same interval as those of the conductive tape, the contour of a window of the adhesive tape being within the contour of the associated window of the conductive tape.

3. The product as claimed in claim 2, wherein the contour of a window of the adhesive tape is parallel to the contour of the associated window of the conductive tape.

4. The product as claimed in claim 3, wherein the contours of two associated windows (3) and (8) are concentric and rectangular.

5. The product as claimed in claim 1, wherein the adhesive piece is an adhesive frame associated with each window of the conductive tape and fastened to the latter so as to project from the contour of the associated window on the inside and on the outside.

6. The product as claimed in claim 1, wherein the contour of the insulating aperture is set apart from the contour of the window of the adhesive piece, in such a way that a part of the associated connection tab is bonded to this tape between these two contours.

7. The product as claimed in claim 1, wherein the contour of the aperture is placed astride the contour of the window formed in the conductive tape.

8. The product as claimed in claim 1, characterized in that it possesses several apertures through both said adhesive piece and said conductive tape, pierced in such a way as to insulate each of several tabs from one another and from the conductive tape.

9. The product as claimed in claim 1, wherein the adhesive piece is composed of an unsupported film of adhesive product.

10. The product as claimed in claim 1, wherein the adhesive piece is formed round the window of the conductive tape by molding on an adhesive product within and on the outside of the contour of the said window.

11. The product as claimed in claim 1, wherein the electronic component is an integrated circuit in the form of a "chip".

12. The product as claimed in claim 1, characterized in that the conductive tape has rows of transport holes running along its lengthwise margins, said adhesive piece is a tape whose width is less than the lateral distance between said rows of transport holes, and said adhesive piece is disposed between said rows of holes.

* * * * *